United States Patent [19]

Fujiwara et al.

[11] Patent Number: 4,502,047
[45] Date of Patent: Feb. 26, 1985

[54] ELECTRONIC PARTS-MOUNTING DEVICE WITH EASY ASSEMBLY AND MAINTENANCE

[75] Inventors: Kaisaku Fujiwara, Kanagawa; Shigenori Yokooji; Yasuji Morishita, both of Odawara, all of Japan

[73] Assignee: Hitachi, Ltd., Tokyo, Japan

[21] Appl. No.: 322,690

[22] Filed: Nov. 18, 1981

[30] Foreign Application Priority Data

Nov. 19, 1980 [JP] Japan .................... 55-161992

[51] Int. Cl.³ .................. G08B 23/00; G08B 17/00
[52] U.S. Cl. ........................ 340/693; 312/7.1; 312/352; 340/584; 340/595; 340/646; 340/653; 361/103; 361/384; 361/390
[58] Field of Search ............ 340/693, 584, 653, 595, 340/646; 361/380, 390, 384, 383, 103; 165/DIG. 5, DIG. 6; 312/352, 7.1

[56] References Cited

U.S. PATENT DOCUMENTS 3,893,108  7/1975  McBride, Jr. et al. ............ 340/584
4,027,206  5/1977  Lee .................................. 361/384

Primary Examiner—Glen R. Swann, III
Attorney, Agent, or Firm—Antonelli, Terry & Wands

[57] ABSTRACT

Two substrates respectively mounting electric parts are disposed so that parts-mounting faces of the two substrates oppose each other. The opposed substrates are connected at the respective opposing side edges thereof to each other by means of respective cover plates. High voltage electric parts are mounted on one of the substrates, while heat/electromagnetic wave generating electric parts are mounted on the other of the substrates to obtain heat radiation and electromagnetic wave shielding.

9 Claims, 8 Drawing Figures

ELECTRONIC PARTS-MOUNTING DEVICE WITH EASY ASSEMBLY AND MAINTENANCE

BACKGROUND OF THE INVENTION

The present invention relates to an electronic device and more specifically, concerns an electronic device in which heat generating electric parts and electromagnetic wave generating electric parts are separately mounted.

This type of electronic device, for example, a power supply device which supplies power to various types of motors, generally handles high power ranging from a few hundred watts to few hundred kilo-watts. Therefore, it is necessary for the power supply device to effectively radiate heat generated from semiconductors, resistors and the like therein. In addition, a recent tendency is that the output power frequency of the power supply device is changed from a few killoheltz to a few hundred kiloheltz and therefore, electromagnetic wave leakage externally out of the power supply device must be prevented in order to avoid undesirable effect of the leaked electromagnetic waves on apparatus or devices surrounding the power supply device. Furthermore, since an apparatus or unit in which the power supply device is incorporated, for example, a magnetic tape storage or a magnetic disk memory is required to be more compact, the power supply device itself must be made more compact correspondingly.

SUMMARY OF THE INVENTION

Accordingly, it is an object of the present invention to provide an electronic device which is easy to assemble and maintain.

It is another object of the present invention to provide an electronic device which allows an effective radiation of heat generated from electric parts as well as an effective shielding of electromagnetic waves generated from electric parts or components.

These objects can be achieved, according to the present invention, by providing an electronic device in which two substrates each mounted with electric parts are disposed so that the parts-mounted faces of the substrates oppose to each other, and the two substrates are tightly connected to each other by means of cover plates inserted and fitted into the respective opposing two side edges of the substrates. According to another feature of the present invention, high voltage electric parts and heat/electromagnetic wave generating parts are mounted on said different substrates, and the substrate mounted with the heat/electromagnetic wave generating electric parts is provided with heat radiating elements and an electromagnetic-wave shielding cover.

BRIEF DESCRIPTION OF THE DRAWINGS

Other objects, features and advantages of the present invention will become apparent from the following detailed description of preferred embodiments thereof taken in conjunction with the accompanying drawings, in which.

DESCRIPTION OF THE PREFERRED EMBODIMENTS

Figure 1:
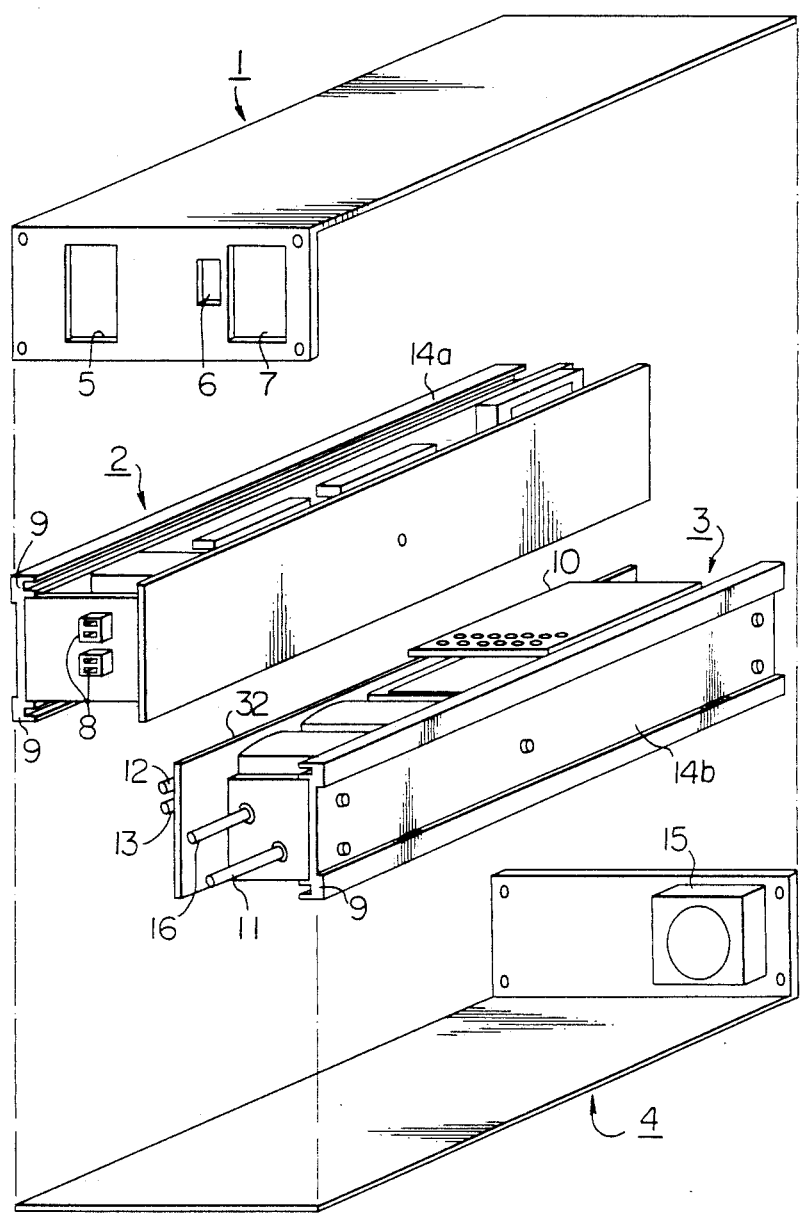
FIG. 1 is an exploded view of an electronic device comprising top/bottom cover plates and input/output units, according to an embodiment of the present invention.

Referring now to FIG. 1, there is shown an exploded view of an electronic device such as a power supply device according to an embodiment of the present invention, which comprises an AC input unit 2 for converting an input commercial voltage to a desired high voltage (more than 42 volts), an output unit 3 including heat radiating elements and electromagnetic-wave generating elements activated by power from the AC input unit 2, and an upper or top cover plate 1 and a lower or bottom cover plate 4 connecting the units 2 and 3 together into a single unit. More specifically, connection between the units 2, 3 and top and bottom cover plates 1, 4 can be effected, as most clearly shown in FIG. 2, by inserting side edge portions of the top and bottom cover plates 1 and 4 into corresponding generally U-shaped grooves 9 of side panels 14a and 14b in the units 2 and 3 and then by tightening them together with appropriate means such as screws. In this way, the power supply device in accordance with the present invention can be easily assembled, since it mainly comprises just four parts.

Explanation will be next made in the order of the AC input unit 2, output unit 3, top and bottom cover plates 1 and 4.

(A) AC input unit 2

This is used to convert input power from a connector 8 to a desired level, and has the side panel 14a which also serves as a heat radiator. The side panel 14a mounts such a heavy part as a transformer, such heat radiating elements as diodes and the like. The unit 2 also has a function of cutting off the input power in the event that the temperature within the output unit 3 reaches an abnormally high level. Since the side panel 14a in this unit 2 serves both as a support on which elements are mounted and as a heat radiator, in this way, the unit 2 can be made compact.

(B) Output unit 3

This comprises an output assembly 50 (see FIG. 3), a control assembly 40 (see FIGS. 5 and 6) mounted on the assembly 50, and an electro-magnetic wave shielding cover 10 covering the assemblies 50 and 40 (see FIG. 1).

(1) Control assembly 40

Figure 5:
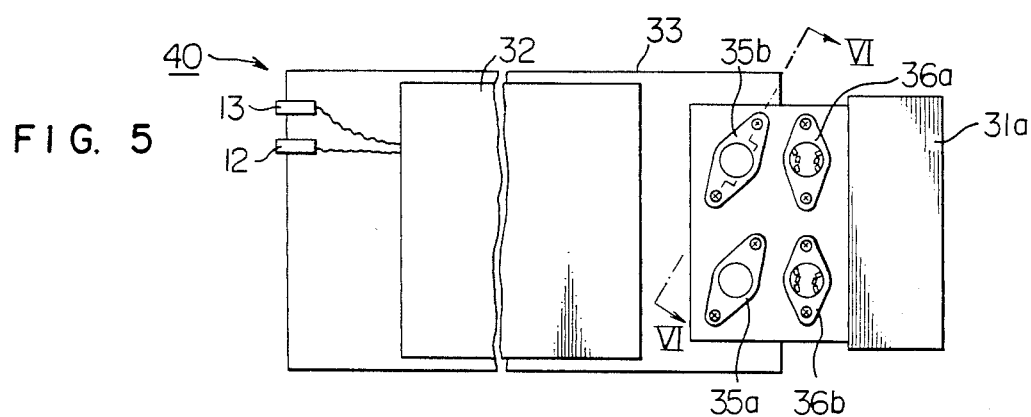
FIGS. 5 and 6 show a left side view and a plan view of the control assembly, respectively.
Figure 6:
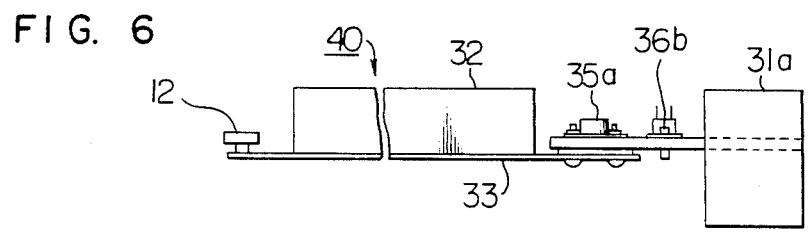
Figure 7:
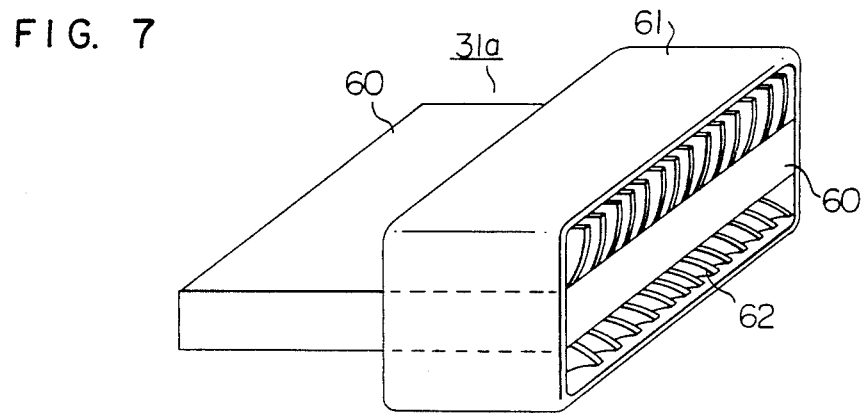
FIG. 7 is a perspective view of a heat transfer element connected to the control and output assemblies.

As illustrated in FIGS. 5 and 6, this assembly 40 comprises a control circuit 32 for control of the output assembly 50; a heat transfer element 31a on which power transistors 35a and 35b which radiate heat and temperature detectors 36a and 36b are mounted; and a substrate 33 which carries an alarm lamp 12, a power-off indication lamp 13, the above-mentioned control circuit 32 and heat transfer element 31a. The control assembly 40 radiates heat generated at the power transistors 35a and 35b and the like through the heat transfer element 31a while detecting the temperature of the heat transfer element 31a at the temperature detectors 36a and 36b. When the control circuit 32 detects a temperature (a first set temperature) beyond a selected temperature, it will indicate this condition on the alarm lamp 12, while, when the temperature reaches a device destroying level (a second set temperature), it will cut off the input power supplied into the AC input unit 2 and indicate this condition on the power-off indication lamp 13. On the other hand, the heat transfer element 31a includes fins 62 and an air control plate 61 surrounding the fins 62. The fins are shaped into such configurations as shown in FIG. 7 from the heat radiating substrate 60 made of metal, for example, aluminum.

(2) Output assembly 50

Figure 3:
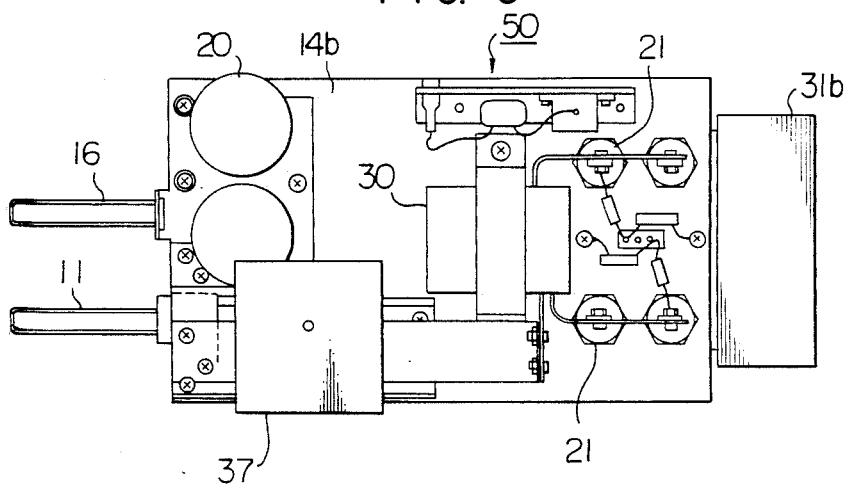
FIG. 3 is a left side view of an output assembly used in the output unit of the electronic device of FIG. 1.

FIG. 3 shows a plan view of the output assembly 50 which includes a main transformer 30 for rectifying input power and power transistors 21 mounted on the side panel 14b. Heat emitted from the transformer and transistors will be radiated through a heat transfer element 31b into the ambient air. The output of the transformer 30 is supplied from a plus terminal 16 and a minus terminal 11. In this way, the side panel 14b has three functions of carrying various elements including the main transformer, supplying the minus potential from the transformer 30 to the minus terminal 11, and transferring heat generated at various elements thereon to the heat transfer element 31b. In this embodiment, the side panel 14b is insulated from the plus side of the transformer 30 by means of proper insulating material such as insulating paper.

(3) Electromagnetic-wave shield cover 10

Figure 4:
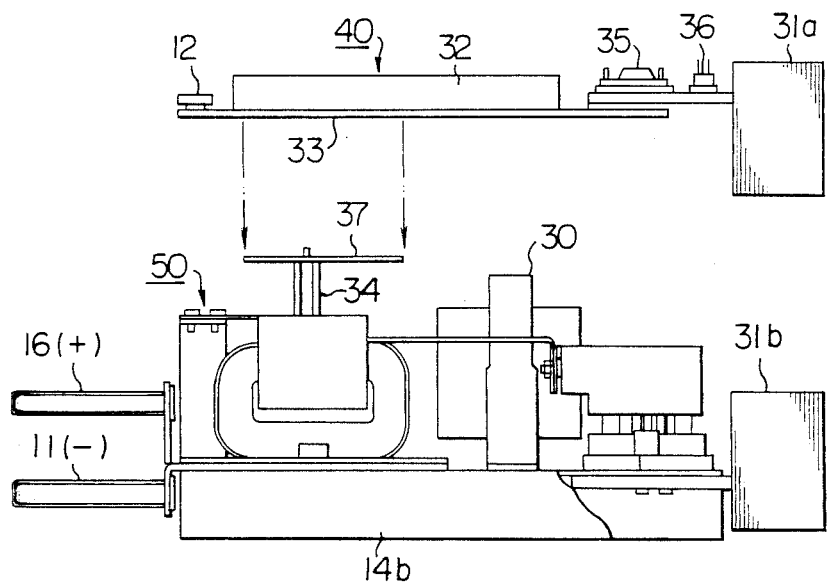
FIG. 4 is a view showing the positional relationship when a control assembly is mounted on the output assembly to form the output unit 3.

The output unit 3 is assembled by mounting the control assembly 40 onto a fixing post 34 of said output assembly 50 through an insulating paper 37 as shown in FIG. 4, and subsequently by covering them with the electromagnetic-wave shield cover 10 as shown in FIG. 1. The output unit 3 as assembled will have three functions of radiating heat caused by the transistors 21 and 35 and the like through the heat transfer elements 31b and 31a into the air, primary-shielding electromagnetic waves generated from the transformer 30 and the like with the use of the electromagnetic wave shielding cover 10, and turning on the alarm lamp 12 and the power-off indication lamp 13 in the case of an abnormally high temperature.

(C) Top cover plate 1

This plate is provided at its front portion with a window 5 through which the connectors 8 of the input unit 2 extend, a window 7 through which the terminals 11 and 16 of the output unit 3 extend, and a window 6 through which the light from the alarm lamp 12 and power-off indication lamp 13 can be externally emitted for warning, as shown in FIG. 1.

(D) Bottom cover plate 4

When this plate is mounted integrally onto the output unit 3, an electric fan 15 will be positioned in opposed relationship to the heat transfer elements 31a and 31b within the output unit 3, thereby allowing a forced cooling of the heat transfer elements.

In this connection, the fan 15 is driven so as to send air inwardly of the power supply device if it is desired to effectively cool the heat transfer elements 31a and 31b alone, and so as to send air outwardly thereof when it is desired to effectively cool the entire interior of the device.

Figure 2:
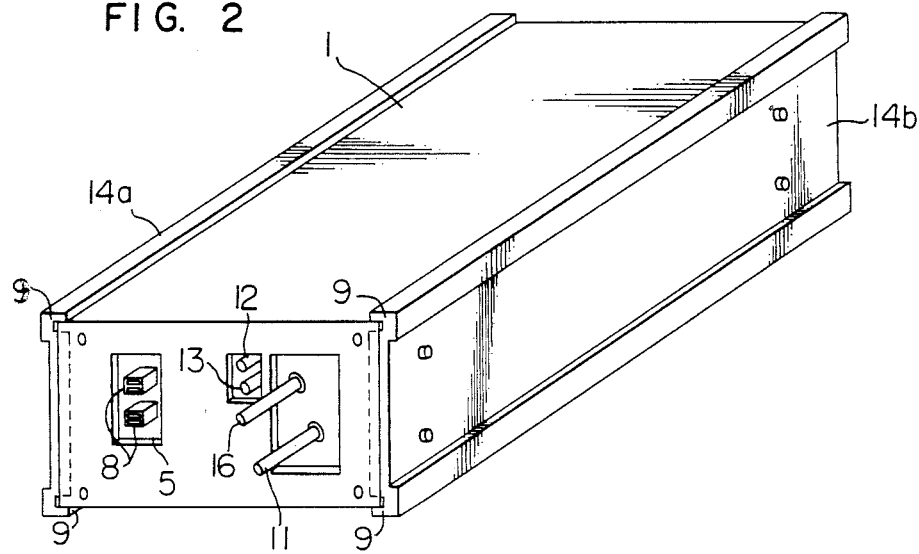
FIG. 2 is a perspective view of the electronic device, with the device assembled.

By combining together the input and output units 2, 3 and top and bottom cover plates 1, 2 in the manner described above, an integrally assembled power supply device can be obtained as shown in FIG. 2. The assembling, as has been already explained, can be achieved by inserting and fitting the side edges of the top and bottom cover plates 1 and 2 into the respective generally-U-shaped grooves 9 of the input and output units 2 and 3, and subsequently by tightening it together with screws or other proper means. Secondary electromagnetic-wave shielding effect can be obtained by the fitted engagment of the top and bottom cover plates 1 and 4 with the input and output units 2 and 3 at the fitting portions 9 thereof. This secondary shielding effect will be explained more in detail in connection with FIG. 8.

Figure 8:
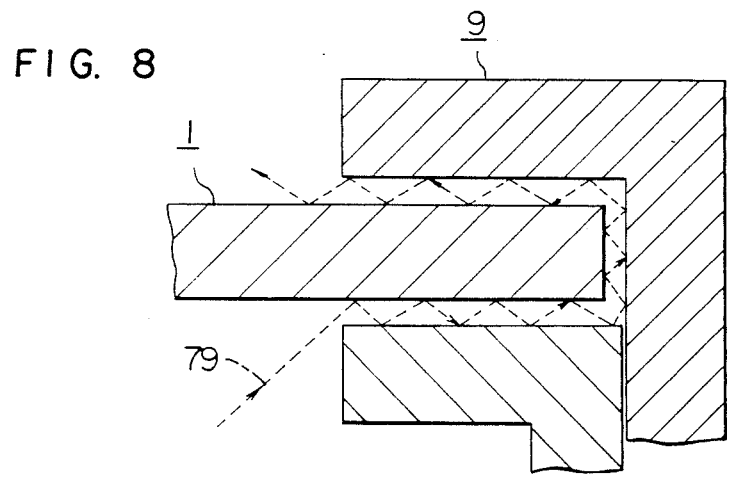
FIG. 8 is a cross-sectional view of an engagement portion of the associated substrate fitted with an associated side panel.

FIG. 8 illustrates a cross-sectional view of the top cover plate 1 and associated grooves 9 of the input unit 2 in the engagement condition therebetween. In operation, electromagnetic waves 79 generated within the power supply device are reflected or deflected multiple times and are gradually attenuated between a very narrow gap between the engaged portion 9 and the side edge of the top cover plate 1. This will enable the prevention of leakage of unwanted electromagnetic waves externally out of the power supply device.

With the arrangement as has been described above, the present invention has the following advantages.

(a) Since the electronic device comprises four main components, it is very easy to assemble and maintain.

(b) Since the electronic circuit portion of the electronic device is dividedly incorporated depending upon the type of electric elements into the AC input unit which handles high voltage and the output unit which generates undesirable electromagnetic waves, it is easy to maintain.

(c) Double functions of the side panels in the AC input unit as an element carrier and as a heat radiator (heat transfer body) will enable a realization of a compact device.

(d) Since most of the heat emitting elements are incorporated only in the output unit and an electric fan is provided in the vicinity of the heat radiating fins of the output unit, a high heat radiating efficiency can be obtained.

(e) Since the output assembly of the output unit has three functions of an element carrier, a heat radiator (heat transfer body) and an electrode (minus), a compact electronic device can be realized.

With respect to the output assembly, primary shielding from electromagnetic waves from the transformer and the like incorporated therein can be effected with the electromagnetic wave shielding cover.

(f) Since assembly of the input and output units and top and bottom cover plates can be performed by inserting the side edges of the top and bottom cover plates into the U-shaped grooves of the units and then by fixing them together with screws or other proper means, undesirable electromagnetic waves emitted from the transformer and the like can be attenuated at the U-shaped grooves, thereby providing secondary shielding effect.

As a result, the electronic device in accordance with the present invention has such advantages as easy assembly, effective heat radiation and good electromagnetic wave shielding effect.

We claim:

1. An electronic device including a plurality of electric parts, first and second plate-like substrates each mounting on one face a portion of said electric parts and positioned so that said faces oppose each other, a first cover plate having a first side connected to a first side of said first substrate and a second side (opposed to said first side) connected to a first side of said second substrate, and a second cover plate having a first side connected to a second side of the first substrate (opposed to said first substrate first side) and a second side (opposed to said second plate first side) connected to a second side of the second substrate (opposed to said second substrate first side).

2. An electronic device as set forth in claim 1 further including a thrid cover plate extended from a third side of said first cover plate for covering one side face of said first and second substrates, and a fourth cover plate extended from a third side of said second cover plate for covering another side face of the first and second substrates opposed to said one side face.

3. An electronic device as set forth in claim 2 wherein said first and second substrates are made of conductive material.

4. An electronic device as set forth in claim 1 or 2 wherein said first substrate is provided at said first and second sides with engagement means for engagement with said first sides of said first and second cover plates, and said second substrate is provided at said first and second sides with engagement means for engagement with said second sides of the first and second cover plates.

5. An electronic device as set forth in claim 1 or 2 wherein said first substrate mounts high voltage electric parts, and said second substrate mounts heat/electromagnetic-wave generating electric parts.

6. An electronic device as set forth in claim 5, further including power supplying means for supplying power to said electric parts, temperature detecting means for detecting the temperature generated by said heat generating electric parts, control circuit means for generating a warning signal for warning indication when the temperature detected by said temperature detecting means exceeds a first set level of safe temperature of said electronic device and for generating a power-off signal so as to cut off power supplied to said electric parts by said power supplying means when said detected temperature exceeds a second level higher than said first level, and warning means for indicating the warning as soon as said control circuit means generates said warning signal.

7. An electronic device for transforming input power comprising a first substrate mounting high voltage electric parts for converting said input power to a desired high voltage, said first substrate being made of a substantially rectangular conductive plate and being provided with engagement means at its first side and its second side opposite to said first side; an input unit including the first substrate, said input unit having a substantially square-pillar configuration and the first substrate forming one side of the input unit; a second substrate mounting heat/electromagnetic wave generating electric parts and receiving the power converted by the input unit, said second substrate being made of a substantially rectangular conductive plate and being provided with engagement means at its first side and second side opposed to said first side; a shielding cover for covering said electromagnetic-wave generating parts mounted on the second substrate to provide primary shielding from electromagnetic waves; an output unit including the second substrate, said output unit having a substantially square pillar configuration and the second substrate forming one side of the output unit, and top and bottom cover plates inserted and fitted into said respective engagement means of the first and second substrates in said one sides of the input and output units so that the input unit is disposed close to the output unit and the electric parts mounted on the first and second substrates face to each other, thereby covering the top and bottom of the input and output units.

8. An electronic device as set forth in claim 7 including heat transfer elements thermally connected to said second substrate of said output unit for radiating heat generated at said heat generating electric parts, and a fan mechanism for sending air to said heat transfer elements to help the heat radiation thereof.

9. An electronic device as set forth in claim 8 comprising a temperature detector for detecting the temperature in the vicinity of said heat transfer elements; control circuit means for generating an alarm signal for warning indication when the temperature detected by said temperature detector exceeds a first set level and for generating an input power-off signal when said detected temperature exceeds a second set level higher than said first set level; an alarm lamp being turned on for indicating the warning for abnormal temperature in response to said alarm signal; and a power-off indication lamp for indicating the cutting off of said input power into the input unit in response to said input power-off signal.

* * * * *